United States Patent [19]

Jewett

[11] 4,289,571
[45] Sep. 15, 1981

[54] METHOD AND APPARATUS FOR PRODUCING CRYSTALLINE RIBBONS

[75] Inventor: David N. Jewett, Harvard, Mass.

[73] Assignee: Energy Materials Corporation, Ayer, Mass.

[21] Appl. No.: 51,998

[22] Filed: Jun. 25, 1979

[51] Int. Cl.³ .................... C30B 15/06; C30B 35/00
[52] U.S. Cl. .................... 156/617 H; 156/DIG. 88; 156/DIG. 97; 422/249
[58] Field of Search .............. 156/608, 617 H, 617 S, 156/617 P, DIG. 64, DIG. 88, DIG. 97; 75/135, 143; 65/83, 85, 99 A, 204, 336, 345, 33; 422/246, 249

[56] References Cited

U.S. PATENT DOCUMENTS

| | | | |
|---|---|---|---|
| 1,364,895 | 1/1921 | Slingluff | 156/617 SP |
| 2,698,467 | 1/1955 | Tarquinee et al. | 75/135 |
| 3,370,927 | 2/1968 | Faust, Jr. | 156/DIG. 97 |
| 3,413,098 | 11/1968 | Dermartis | 156/619 |
| 3,464,812 | 9/1969 | Utech et al. | 75/65 |
| 3,494,745 | 2/1970 | Herczog et al. | 156/DIG. 97 |
| 3,759,671 | 9/1973 | Bleil | 156/DIG. 97 |
| 4,000,030 | 12/1976 | Ciszek | 156/617 SP |
| 4,083,748 | 4/1978 | Gault | 156/609 |
| 4,097,584 | 6/1978 | Reuschel et al. | 423/348 |
| 4,099,924 | 7/1978 | Berkman et al. | 156/DIG. 88 |
| 4,116,641 | 9/1978 | Ciszek | 156/617 SP |
| 4,116,642 | 9/1978 | Chu et al. | 156/617 SP |

FOREIGN PATENT DOCUMENTS

| | | | |
|---|---|---|---|
| 2633961 | 2/1977 | Fed. Rep. of Germany | 156/617 SP |
| 1335527 | 5/1962 | France | 156/617 SP |
| 52-52611 | 5/1977 | Japan | 156/617 SP |

*Primary Examiner*—Gregory N. Clements
*Attorney, Agent, or Firm*—Morse, Altman, Oates & Dacey

[57] ABSTRACT

A method and associated apparatus are disclosed for the continuous formation of single crystal silicon ribbons. A seed crystal is placed on the surface of a pool of molten silicon and pulled at a slight angle above the horizontal over the edge of a meniscus attachment member at a rate commensurate with the rate of growth of the ribbon. The formation of the ribbon is controlled in part by a submerged stabilizer disposed under the molten silicon below the advancing edge of the ribbon at the surface of the silicon. A thermal impedance is provided below the surface of the molten silicon to provide stability in the formation of the ribbon and to provide the proper temperature gradients conducive to the efficient formation of the ribbon from the molten material.

8 Claims, 12 Drawing Figures

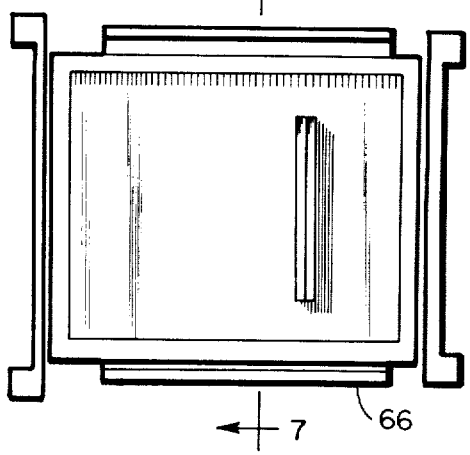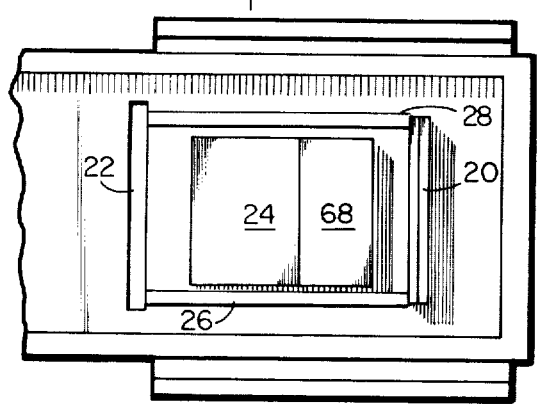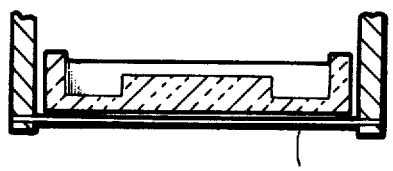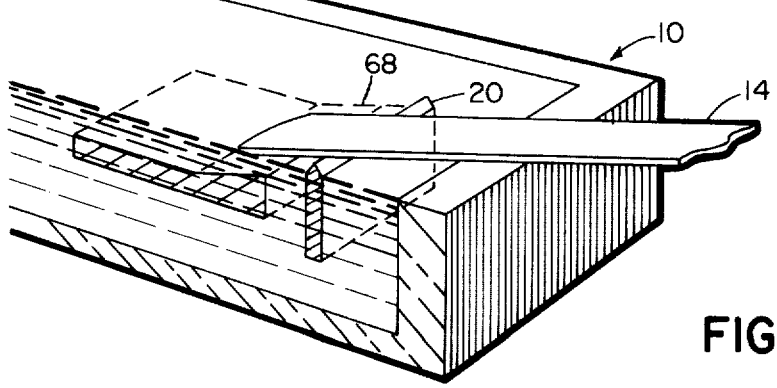

METHOD AND APPARATUS FOR PRODUCING CRYSTALLINE RIBBONS

BACKGROUND OF THE INVENTION

1. Field of the Invention

This invention relates generally to the formation of a single crystal ribbon and more particularly is directed towards a novel method and associated apparatus for the continuous formation of silicon crystal ribbons.

2. Description of the Prior Art

Single crystal semiconductive wafers for various electronic applications typically have been grown in the form of rods by pulling a seed crystal slowly upwards from a pool of molten silicon. The rod, once formed, is then sliced into thin wafers which again may be cut into smaller semiconductive components. This procedure is quite slow and expensive in view of the fact that much of the material is wasted in the cutting operation. In order to eliminate some of the problems inherent in the vertical pulling techniques, considerable effort has been directed towards forming the semiconductive material directly into a ribbon, thereby eliminating the waste and time involved in cutting rods into wafers. A thin, monocrystalline ribbon, once formed, may then by suitably scored in the desired pattern and the several elements broken away from the ribbon for component use.

While the thin ribbon could be drawn directly through a slot in a die in a vertical direction above a pool of molten material, the procedure is extremely slow. More recent efforts have been directed towards the pulling of a ribbon horizontally from the surface of a pool of molten semiconductive material which technique provides a greater solid/liquid interface area of crystal formation and, hence, is more productive than vertical crystal growing procedures. However, the techniques and the apparatus utilized heretofore in the growing of monocrystalline semiconductive ribbons using the horizontal pulling procedures have not been satisfactory from the standpoint of quality, uniform thickness and width and operating stability.

Accordingly, it is an object of the present invention to provide improvements in the method and associated apparatus for forming crystalline, semiconductive ribbons on a continuous basis.

Another object of this invention is to provide a novel method and associated apparatus for producing high quality semiconductive ribbons at a high rate of production and of uniform dimensions.

SUMMARY OF THE INVENTION

This invention features a method of growing, on a continuous basis, a ribbon of crystalline, semiconductive material, comprising the steps of forming a pool of molten semiconductive material, placing a crystalline seed at the surface of the pool, pulling the seed at a low angle from the surface of said pool and over the edge of a meniscus attaching wall at a rate corresponding to the formation of solid crystal ribbon and controlling and stabilizing below the pool surface the rate of crystal formation in width and thickness.

This invention also features and apparatus for use in the continuous production of crystalline semiconductive ribbons, comprising a relatively shallow trough adapted to contain a quantity of molten semiconductive material, a scraper disposed below the surface of the molten material with the upper edge thereof disposed proximate to the surface and adapted to form a raised meniscus between the lower face of the ribbon draw at a low angle over the edge of the meniscus attaching wall. An advancing edge stabilizer is disposed below the surface of the pool and below the advancing edge of the solid ribbon for automatically compensating for changes in pull speed, growth speed, temperature of melt and other factors. Lateral stabilizers are provided below the pool surface on either side of the ribbon to control the ribbon width and a thermal impedance is mounted below the interface of the ribbon and the liquid material for controlling thermal convection.

BRIEF DESCRIPTION OF THE DRAWINGS

FIG. 6 is a top plan view illustrating a modification of the invention, FIG. 7 is a cross-sectional view taken along the line 7—7 of FIG. 6, FIG. 8 is a top plan view illustrating a further modification of the invention, FIG. 9 is a cross-sectional view taken along the line 9—9 of FIG. 8, FIG. 10 is a cutaway perspective view of the FIG. 8 embodiment.

DETAILED DESCRIPTION OF THE PREFERRED EMBODIMENTS

In accordance with the present invention a continuous ribbon is formed by placing a seed crystal on the top surface of a pool of molten silicon, the temperature at the surface being adjusted to produce solidification. The seed is then pulled from the pool surface at a slight positive acute angle over the edge of the upper edge of a wall at a rate commensurate with the rate of growth of the leading edge of the crystal in a direction opposite to the pull direction. The pool of silicon is maintained at a shallow depth and at a relatively constant level to insure that the advancing edge of the ribbon at the solid/liquid interface remains stable. The growth of the crystal is stabilized by automatically increasing or decreasing the speed of advance of the ribbon growth edge by passing the advancing edge of the ribbon over a stabilizer below the pool surface. The ribbon is also moved between lateral stabilizers below the pool surface which control the width of a ribbon.

Figure 1:
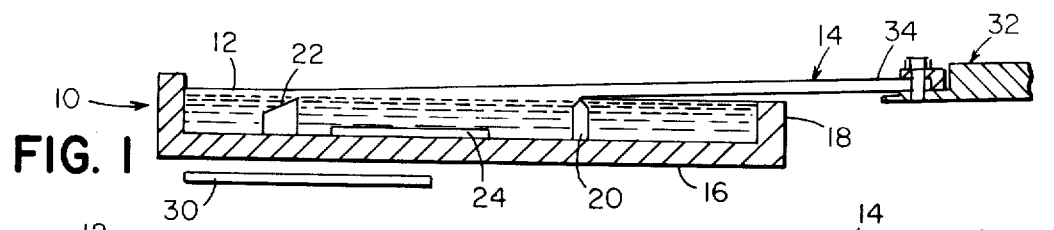
FIG. 1 is a sectional view in side elevation of a crystal ribbon growing apparatus made according to the invention.

Referring now to the drawings and to FIG. 1 in particular, there is illustrated an apparatus for carrying out the above method for continuously drawing a crystalline ribbon out of a silicon melt in accordance with the invention. The apparatus is generally organized about a crucible 10 defining a shallow trough adapted to contain a quantity of silicon melt 12 from the surface of which is drawn a ribbon 14 of crystalline silicon. The trough is quite shallow as compared to prior art apparatus and greatly reduces the adverse effect arising from the convection currents usually present in deep troughs normally used in crystal pulling equipment. The configuration of the crystal growing apparatus in accordance with the present invention is such as to remove the growing region of the ribbon from the bulk of the melt reservoir.

The crucible 10 preferably is fabricated from a high temperature material which will not react with the molten silicon. For this purpose quartz has been found to provide satisfactory results. The crucible of the illustrated embodiment is generally rectangular and includes a bottom wall 16 and low surroundings side walls 18 which contain the molten silicon 12. Mounted within the crucible itself are several passive elements that contribute to the proper formation of the ribbon 14. These elements include an upright wall 20, an advancing edge stabilizer 22, a thermal impedance 24 and a pair of lateral stabilizers 26 and 28. Active components for the system include a heat source 30, typically positioned in or below the bottom wall 16. Also included is a seed holder and pulling mechanism 32 adapted to grip a crystal seed 34, hold it at the pool surface as the ribbon 14 forms and to withdraw the seed and the ribbon 14 at a constant rate in a direction opposite to the direction of crystal growth. The seed puller 32 is positioned to draw the ribbon 14 at a slight positive acute angle, typically 5°, above the horizontal at a rate substantially equal to the rate of the crystal formation on the pool surface.

Figure 2:
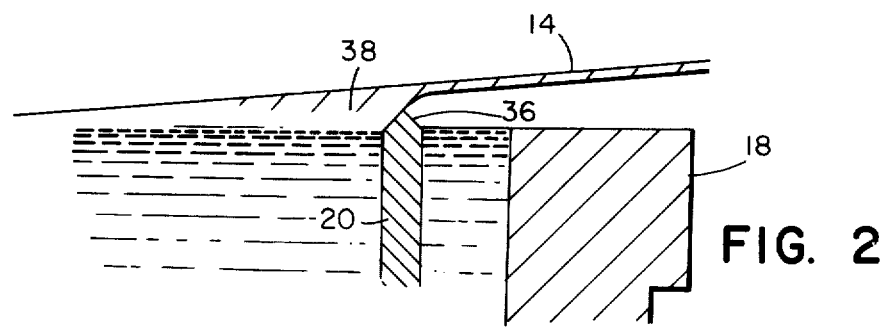
FIG. 2 is a detail view of FIG. 1 on an enlarged scale.

In the preferred form of the invention the ribbon 14 is drawn up over the upper edge of the wall 20. The wall 20 typically is formed from quartz and, in the preferred configuration, is an upright rigid element the upper end of which forms into an edge 36 or more or less even with the upper edge of a side wall 18 as best shown on FIG. 2. The ribbon 14 is drawn over the wall edge at a shallow angle from the pool surface and produces a raised meniscus 38 behind the wall and between the ribbon and the liquid level above the molten silicon. The leading edge of the ribbon where the crystal formation takes place moves in a direction reverse to that of the direction of pull.

Figure 3:
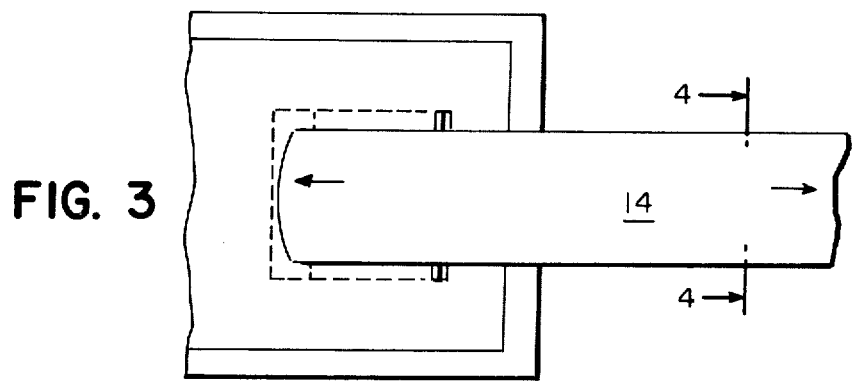
FIG. 3 is a top plan view thereof.
Figure 5:
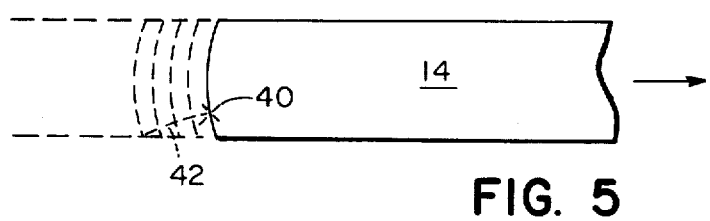
FIG. 5 is a top plan view, somewhat schematic, indicating growth characteristics of a ribbon made according to the invention.

By drawing the ribbon at a slightly positive angle from the pool surface certain beneficial results are obtained. These include the elimination of the need to slightly overfill the crucible which would be required if the ribbon were to be drawn along a true horizontal path. It has been found to be extremely difficult to maintain the melt at a level which would allow the ribbon to be drawn horizontally from a crucible without the melt overflowing. Coupled with this has been the problem of the ribbon freezing to the edge of the crucible. By drawing the ribbon at a slight upward angle, these problems are overcome. The leading edge where the crystal forms is in the shape of an arc where it joins the surface of the melt, as best shown in FIGS. 3 and 5. The shape of the leading edge is determined by the temperature field just under and in front of the leading edge, which field is determined by the temperature gradients introduced by the stabilizer. This shape at the advancing edge of the crystal contributes to a higher quality ribbon for the reason that any imperfection which may develop in the crystal formation will grow to the side edges of the ribbon rather than continue lengthwise along the ribbon as it is formed if the growing edge were straight. By way of example, in FIG. 5 a crystal growth defect is indicated at 40 and this defect will move generally along the path indicated at 42 towards a side of the ribbon 14 as the growth of the ribbon takes place as represented by dotted line advancing edges. Thus, any defect that may occur has a minimal and self-correcting effect on the ribbon.

Figure 4:
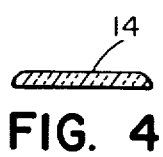
FIG. 4 is a cross-sectional view taken along the line 4—4 of FIG. 3.

The ribbon 14, as shown in FIG. 4, in cross-section has a flat lower surface and an upper surface that is generally flat but slightly rounded at the edges. In general, the thickness of the ribbon is partially a function of how long the ribbon is in contact with the melt and how fast it is growing downward.

Figure 12:
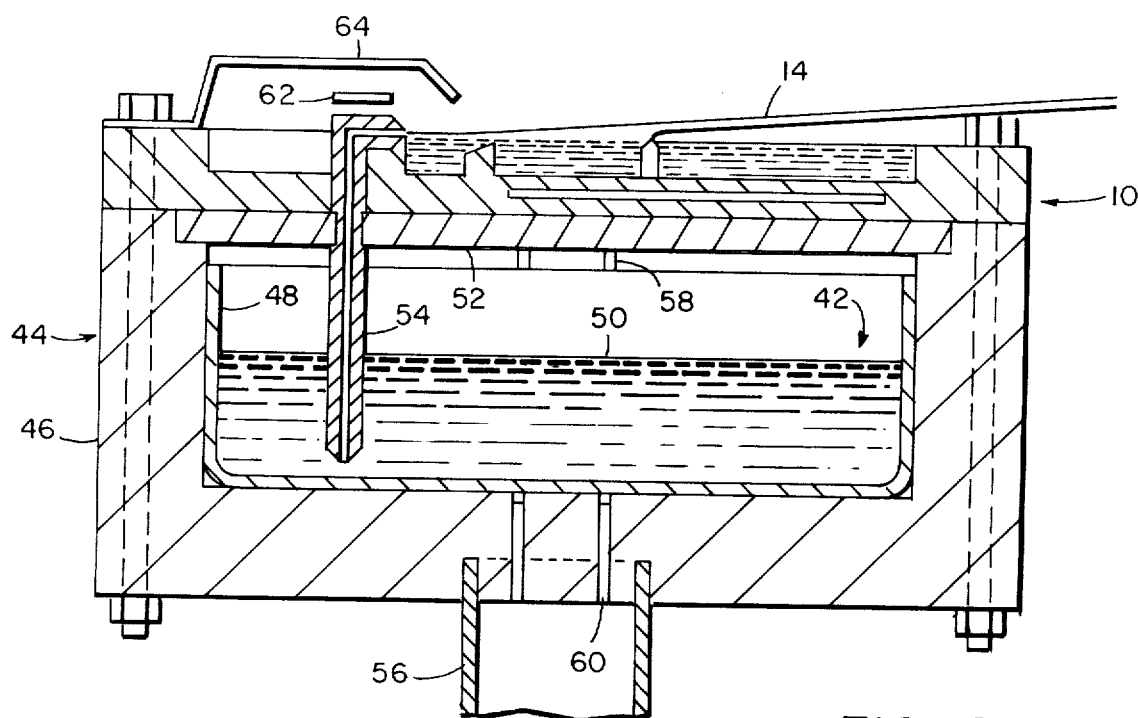

In accordance with the invention and as best shown in FIG. 12, the bulk of the melt is separated from the crystal growing region by containment in a reservoir 42 so that the trough 10 is maintained with a very shallow depth of melt from which the ribbon 14 is formed.

Various melt replenishment systems may be used with the invention and, while FIG. 12 illustrates one such system, other systems are available and may also be utilized. In FIG. 12 the trough 10 is mounted on a housing 44 comprised of an outer box 46, preferably of quartz. The crucible serves as the reservoir 42 for molten silicon 50 to replenish the trough 10. The box 46 includes a positioning plate 52 across the top thereof which serves to provide a pressure seal for the pressure chamber defined by the box and to support a feed tube 54 between the pressure chamber and the trough 10. The lower end of the tube 54 extends below the surface of the melt 50 and terminates above the bottom of the crucible 48. The upper end is bent to extend over the top of the trough 10 to form an outlet through which molten silicon is transferred from the reservoir 42 to the trough 10. The chamber in the box may be pressurized by gas under pressure delivered through a support tube 56 and slots 58 extending along the inner walls of the box and in register with passages 60 communicating with the tube 56. An auxiliary heater 62 may be provided in close proximity to the upper end of the feed tube 54 to maintain the molten condition of the feed and a radiation shield 64 may be provided above the heater, as shown.

The use of a shallow trough in which to grow the ribbon eliminates certain of the destabilizing characteristics inherent in deep crucibles, particularly with respect to convection currents present in deep pools of molten silicon.

The profile of the center of the ribbon is slightly curved and this will occur naturally as the increasing silicon thickness causes a slight decrease in the rate of dissipation of the heat of fusion. This can be controlled by placing a variable heat sink over the solid surface or by varying the supply of heat to the silicon melt.

The desired embodiment of the invention is to maximize the distance between the leading edge of the ribbon and the point at which full ribbon thickness is obtained. This will have the effect of maximizing the surface area of the solid/liquid interface, resulting in maximizing the growth rate and/or minimizing the temperature gradients through which the solidified silicon material must pass. The latter will result in decreased stress in the plastic flow range with resulting improved quality in the ribbon material.

In addition to the requirements on the system set by the desired large solid/liquid interface, there are other conditions which are determined by certain desirable operational features. These include integral edge control. This is accomplished in two steps. First, the problem of convective heat transfer is limited by having the solidification take place in a shallow trough. Secondly, two techniques of maintaining the thermal gradient are shown. In the first case, as shown in FIGS. 6 and 7, side heaters 66 give completely variable heat input to the solidifying ribbon edges. In the second technique shown in FIGS. 8-10, the floor of the trough is thicker under the area where the crystallization takes place defining a ramp 68. A bottom heater 70 supplies heat evenly to the trough floor, and due to the floor thickness variation, the region of growth is bounded by hotter areas which will limit the ribbon width. The addition of heat shields on the edges can supplement this effect.

Operationally, this system provides great simplicity. There will be a slight increase in width with increasing growth speed, since the total trough temperature will be decreased due to the rate of solidification. Obviously, heaters could be added if necessary.

A second feature of the apparatus relates to the prevention of the growing ribbon from freezing to the equipment. In the present case the solidifying area is surrounded by a small hot zone which contributes to the control of the width of the ribbon. The edge of the wall over which the ribbon is pulled is almost covered by the liquid silicon. The temperature should be adjusted to provide just a small amount of melt back to the trough at this point, rather than continued solidification. In practice, the bottom heater may be in two separately controlled elements to provide adequate thermal isolation although the trough bottom can adequately provide the desired temperature profiles. In the case of freezing, the scraper is surrounded by a hot region of liquid to provide easy melt back to eliminate the possibility of silicon flood upon melting after a freeze condition.

In operation, after the trough 10 is filled with molten silicon 12, the temperature is dropped until an island of silicon solid begins to form. Adjustments of heaters and thermal shields for future runs are based upon the shape of the island. The temperature of the melt is then carefully raised until the island just melts. The silicon seed 34 is then inserted to touch the melt in the region where the island has formed. As the edge of the ribbon grows away from the wall 20, the ribbon 14 is withdrawn over the wall. The pull speed of the puller 32 will be increased as the trough temperature is decreased, maintaining the growing edge of the crystal in the region where the original island appeared. Allowing crystal growth to extend beyond that area will indicate that the hot protective areas are approaching the freezing temperature and that the trough temperature should be raised slightly.

Figure 11:
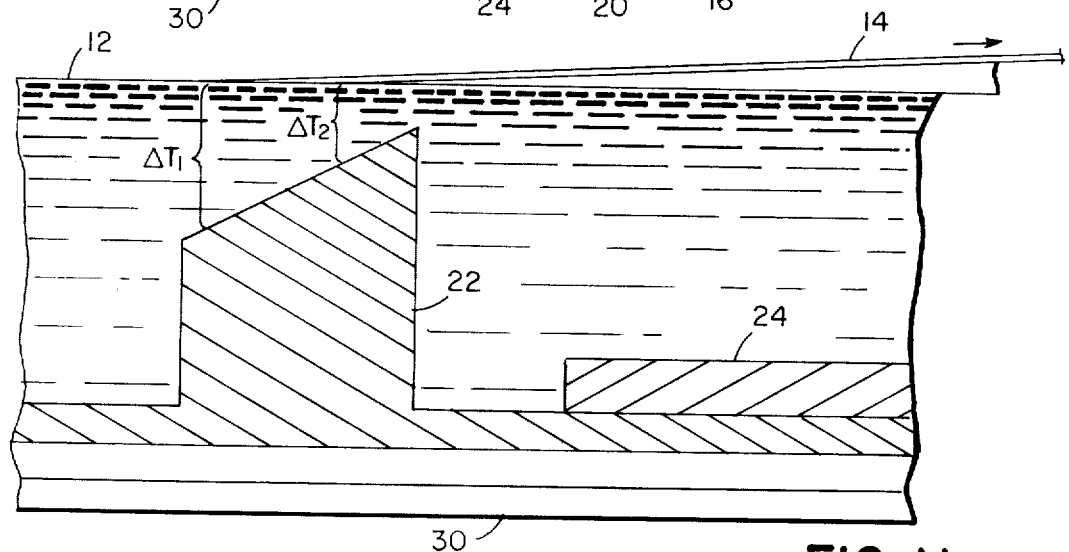
FIG. 11 is a detail sectional view of FIG. 1 on an enlarged scale, and, FIG. 12 is a sectional view in side elevation illustrating a further modification of the invention.

The stabilizer 22 is positioned rearwardly of the wall 20, extending perpendicularly upwards from the bottom wall 16 and transversely of the trough. The top surface of the stabilizer may be inclined downwardly from front to rear with the upper edge thereof positioned slightly below the surface of the melt and below the advancing edge of the ribbon where it meets the melt surface. More complex contours may also be used. The function of the stabilizer is to compensate for small changes in the pull speed of the ribbon as it is withdrawn from the pool. At a steady state of pull and stable temperature conditions no problems should arise. However, if the pull speed S increases by $\Delta S$, then the advancing edge of the ribbon moves forwardly or to the right, as viewed in FIG. 11, by the distance $\Delta X$ such that $\Delta T$ decreases from $\Delta T1$ to $\Delta T2$ enough to increase the growth speed of the advancing edge by $\Delta S$. The stabilizer thus responds to changes in pull speed, growth speed, temperature of melt, emissivity, etc. The speed of advance of the ribbon is equal to $S = f1 (1/\Delta T)$ where $\Delta T = f2 (\Delta X)$, thus $S = f1 (f2 (\Delta X))$.

Thus the advancing edge remains stable within a range of pull speed and temperature. Likewise, with the use of the lateral stabilizers 26 and 28 the ribbon width remains substantially stable. Within the stable range of the advancing edge, the pull speed controls only the thickness of the ribbon in addition to productivity.

While the invention has been described with particular reference to the illustrated embodiments, numerous modifications thereto will appear to those skilled in the art. For example, while the invention has been described primarily with respect to the formation of crystalline silicon ribbons, it may be used to advantage in the ribbon formation of a variety of other crystal materials that are prepared directly from the melt. Such materials may be conductive, non-conductive or semi-conductive and may have a variety of different applications. For example, saphire windows may be formed with this procedure or bubble memory material, namely, gadolium, galium and garnet may be fabricated in ribbon form.

Having thus described the invention, what I claim and desire to obtain by Letters Patent of the United States is:

1. The method of forming a crystalline ribbon from a melt, comprising the steps of
  (a) heating a melt in a crucible having a rim therebout,
  (b) placing on the surface of said melt a crystalline seed having a free edge and a distal pulling edge,
  (c) controlling the temperature of said melt to allow solidification of said melt at said free edge of said seed to form a ribbon in one longitudinal rearward direction while withdrawing in a substantially opposite longitudinal forward direction said seed from said melt at a low positive acute angle with respect to the melt surface at a speed commensurate with the longitudinal growth of said ribbon,
  (d) providing a separate site of attachment inwardly of the rim of said crucible for a meniscus formed by the melt from the lower face of said ribbon as it leaves the surface of said melt to reduce spillage and freezing thereof,
  (e) passively adjusting the growth rate of said ribbon to the changes in the speed of movement of said ribbon by drawing the growing end of said ribbon from the surface of said melt above a sub-surface stabilizer having an uppermost forward portion disposed closer to the melt surface than the lowermost rearward portion thereof, and,
  (f) thermally isolating the crystal growing portion of said melt from the remaining portion thereof.

2. The method of claim 1 including the step of forming said melt into a relatively shallow pool from which said ribbon is withdrawn.

3. The method of claim 1 including the step of controlling the temperature of said melt selectivity within the melt below both side edges of said ribbon to control the width of said ribbon.

4. The method of claim 1 including the step of replenishing the supply of melt in said crucible to maintain a substantially constant level therein.

5. The method of claim 1 wherein said melt is silicon.

6. Apparatus for forming a crystalline ribbon from a melt, comprising (a) a relatively shallow crucible adapted to contain a quantity of said melt, (b) heating means operatively associated with said crucible for controlling the temperature of said melt, (c) seed holder and pulling means operatively associated with said crucible for drawing in a first forward direction a crystal seed from the surface of said melt as a ribbon at a small positive angle with respect to the melt surface at a longitudinal speed commensurate with the rate of solidification of said melt at the growing end of said ribbon, said ribbon forming a meniscus between the lower face thereof and the surface of said melt, (d) meniscus attachment means mounted to said crucible between the surface of said melt and the lower face of said ribbon to provide a stable lower edge for attaching a meniscus formed by the melt, and said ribbon, and, (e) passive sub-surface growth edge stabilizing means mounted to said crucible below the growing end of said ribbon and transverse to the length of said ribbon for selectively increasing and decreasing the rate of ribbon growth in a second rearward direction according to the speed of said pulling means, (f) said stabilizing means including an upright member mounted to said crucible below the surface of said melt and formed with a contoured upper face the uppermost forward portion of which is disposed closer to the melt surface than the lowermost rearward portion thereof and extending transversely with respect to said first forward direction.

7. Apparatus according to claim 6 including sub-surface lateral stabilizing means disposed in said crucible below the side edges of said ribbon for controlling the width thereof.

8. Apparatus according to claim 6 wherein said meniscus attachment means is an upright member terminating in a horizontal straight edge extending transversely below the path of said ribbon to provide a stable locus of meniscus attachment.

* * * * *